United States Patent [19]
Bremstahler

[11] 3,953,771
[45] Apr. 27, 1976

[54] MULTIPLE TRIMMER CAPACITOR, PARTICULARLY FOR ADJUSTMENT OF CRYSTAL OSCILLATORS

[75] Inventor: Manfred Bremstahler, Ruckersdorf, Germany

[73] Assignee: Firma Stettner & Co., Lauf, Pegnitz, Germany

[22] Filed: Oct. 9, 1974

[21] Appl. No.: 513,229

[30] Foreign Application Priority Data
May 21, 1974 Germany............................ 2424559

[52] U.S. Cl................................ 317/248; 317/249 D
[51] Int. Cl.² ............................................ H01G 5/06
[58] Field of Search............ 317/248, 249 R, 249 D; 58/23 AC; 331/116 R

[56] References Cited
UNITED STATES PATENTS

| | | | |
|---|---|---|---|
| 3,486,089 | 12/1969 | Wamback et al. | 317/249 R |
| 3,705,335 | 12/1972 | Metzger | 317/249 D |
| 3,838,566 | 10/1974 | O'Connor | 331/116 R X |

FOREIGN PATENTS OR APPLICATIONS

| | | | |
|---|---|---|---|
| 807,382 | 1/1959 | United Kingdom | 317/249 D |

Primary Examiner—Elliot A. Goldberg
Attorney, Agent, or Firm—Flynn & Frishauf

[57] ABSTRACT

A support disk of insulating material is formed with at least two apertures therethrough located side-by-side, and has a metallization layer applied thereto shaped to form a common stator electrode. At least two disk rotors are placed against the common support disk, each having an electrically conducting shaft passing through the respective aperture of the stator, and each disk rotor having a rotor electrode thereon. The disk rotors are, respectively, of different sizes, of different dielectric constant, or of different thickness, or of different dielectric-temperature varying material, and each one of the shafts is carried out to a separate lead to provide a separate terminal for the rotors, individually, against the common stator electrode, to provide for coarse and fine adjustment, by varying, respectively, the rotor having the higher capacitor unit, or to provide for temperature compensation by simultaneously varying the position of two rotors of different dielectric-temperature coefficient. The rotors can be connected together so that both rotors and stators are connected in parallel; or they may be serially connected, for serial adjustment.

15 Claims, 18 Drawing Figures

MULTIPLE TRIMMER CAPACITOR, PARTICULARLY FOR ADJUSTMENT OF CRYSTAL OSCILLATORS

CROSS REFERENCE TO RELATED PATENT AND APPLICATION

U.S. Pat. No. 3,486,089, U.S. application Ser. No. 517,410, filed Oct. 24, 1974, now U.S. Pat. No. 3,898,540, both assigned to the assignee of the present invention.

The present invention relates to a trimmer capacitor and particularly to the type of capacitor which is to be used in connection with a crystal oscillator, to provide for both coarse and fine adjustment; and, especially, to a trimmer capacitor of the miniature and even sub-miniature size for use in regulating the timing of electric oscillator crystal controlled watches.

Trimmer capacitors, as customarily used, are usually foil-type trimmers; such trimmers were used for crystal-controlled oscillators used in clocks, or the like. Fine adjustment and coarse adjustment is then carried out by selectively changing the position of foils, in which the coarse adjustment is done from one side, and the fine adjustment from the other, of coaxial shafts. Trimmers of this type usually have a fairly substantial package or assembly of foils, and have lamella-type rotors. Depending on the type of adjustment, they can be moved conjointly, or singly. Such trimmers have only a limited field of application and it is hardly possible to miniaturize such constructions, and particularly to provide such constructions of a size suitable for quartz oscillator controlled wrist watches. Further, it is desirable that in such wrist watch adjustments, coarse and fine adjustment can be carried out from the same side.

Double-disk trimmer capacitors, multiple trimmers made as a single structural unit of various disk trimmer capacitors have previously been proposed. A ceramic support has been provided on which a plurality of stators are located, each one then having a rotor associated therewith. Each one of the separate trimmers has its own separate function and connection.

It is an object of the present invention to provide a trimmer capacitor which is simple to manufacture, and can be made in miniature and even sub-miniature size, which is compact and yet simple; and which is adapted to manufacture by mass production while resulting in a structure which is easily adjusted, and which is suitable for timing control of crystal oscillator controlled wrist watches. Preferably, additionally, the trimmer capacitor should be of such construction that it can be used for various types of high-frequency circuits in which accurate fine adjustment, low weight, and small space requirements are important.

SUBJECT MATTER OF THE PRESENT INVENTION

Briefly, a support plate forms a common stator, the trimmer being a miniaturized double-disk capacitor, having two rotor elements, both associated with a single stator electrode. The trimmer elements for use in adjusting the oscillator are so arranged that, in accordance with a feature of the invention, they have different capacity and different variation in capacity between maximum and minimum value, and are associated together in a single trimmer capacity unit.

In accordance with another feature of the invention, the dielectric materials of the rotor are so selected that they have different temperature-dielectric constants, so that the trimmer capacitor, besides affording adjustment, may also function as a temperature-compensating element.

The unit in accordance with the present invention is a single element in which two trimmer capacitors are combined to permit a single function to be carried out, one trimmer being provided, in accordance with a feature of the invention, for coarse, and the other for fine tuning of the frequency of a quartz crystal oscillator. The arrangement can be so made that, for comparatively large overall capacity, one rotor element is provided with a high capacity, for coarse adjustment, and another rotor element is made to provide a small capacity, for fine adjustment; the two rotors are then connected in parallel, and to a common stator. Such generally comparatively high capacity values are used in connection with quartz crystal oscillators including capacitative coupling. If small overall capacity is desired, the two rotor elements are connected in series. The rotor element with small capacity is then used for coarse adjustment and the rotor element with large capacity is used for fine adjustment, when series-connected to the common stator.

In accordance with another feature of the invention, the rotors, of equal capacity (as closely equal as possible) but made of material of different dielectric temperature coefficients are connected to provide temperature compensation, or variation in capacity, with respect to temperature, to counteract oppositely occurring variations in the circuit with changes in temperature.

If the stator and, preferably also the rotor, is made of ceramic material, the structure is particularly suitable for subminiaturization and for mass production.

Trimmers in accordance with the present invention which can be adjusted from one side only permit adjustment of the frequency of oscillation within the range necessary to compensate for changes of crystal frequency in wrist watch crystals. Errors and crystal frequency tolerances, as well as capacity tolerances of integrated circuits used in connection with the crystal itself may likewise be compensated. The usual frequencies currently used in watches are 16,384 Hz, 32,768 Hz and 49,152 Hz.

Quartz crystals of commercially customary type usually provide a frequency tolerance of ± 20 ppm. Additionally, the quartz frequency changes due to aging and can likewise change under shock. Changes due to aging introduce an error of about 5 ppm, and changes due to shock about 2 ppm. The capacity range of the trimmers, therefore, must be large enough to compensate for tolerances, for example 5/35 pF or 8/45 pF, respectively. A large frequency variation must be ensured, particularly by the initial capacity of the trimmer capacitor.

Regulation of watches by means of trimmers was found difficult in the past due to the wide control range which the trimmer had to have, and had to maintain in order to ensure the accuracy of the crystal controlled watch. To provide for accurate adjustment, changes in the angle of the rotor disk of less than 1° sufficiently changed the oscillating frequency to affect the accuracy of the watch. By providing a unit which has both coarse and fine adjustment, the difficulty of adjusting a rotor position to less than 1°, to maintain watch accuracy, is eliminated.

To adjust quartz crystal oscillators used in wrist watches, a ceramic miniature double-disk capacitor is suitable in which parallel connected rotor disks of different diameter provide for coarse and fine adjustment of frequency, the rotor disks being coupled to a common stator electrode. The larger one of the rotor disks is used for coarse adjustment; the smaller one, which also has a smaller variation in capacity between minimum and maximum value is used for fine adjustment. Instead of using rotor disks with different diameters or, additionally thereto, rotor disks of different thicknesses, or using dielectrica of different characteristics can be connected together to a single stator electrode to provide for adjustment trimmer rotors.

The invention will be described by way of example with reference to the accompanying drawings, wherein.

Figure 1:
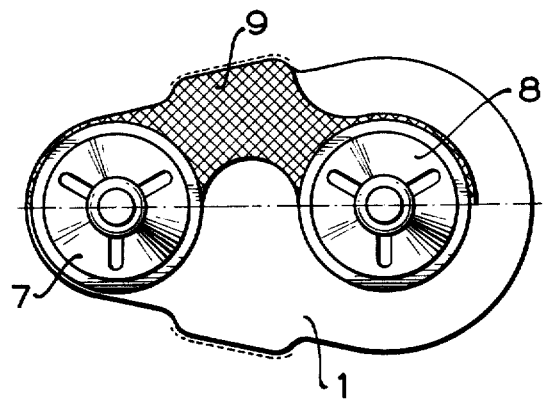
FIG. 1 is a highly enlarged bottom view of a double-disk capacitor, for parallel connection, and using two rotor disks of, for example, 5 mm diameter, and 3 mm diameter, respectively.

The double-disk trimmer capacitor of FIGS. 1–7 has a stator support disk 1, preferably made of a ceramic, which carries the common stator electrode 2 as well as a support section 11 for the smaller one of the rotors and a support section 12 for the larger one of the rotors. The stator disk is formed with two openings, located side-by-side, to receive the adjustment shafts 3, 4 of two rotor disks 5, 6, respectively. Disk 5 is smaller than disk 6. The disks (FIGS. 15–18) are formed with electrode coatings which, for example, may be applied by vapor deposition, metallization, or the like.

The small rotor 5 and the large rotor 6 are formed at the top side with a metallization 13 (FIGS. 15–18), for connection to the respective adjustment screws 3, 4. The electrodes themselves are seen at 14 and inserted into the rotor disk, or applied at a metallization surface which is recessed with respect to the end, and then insulated, to provide for a dielectric between the stator and the rotor electrodes. The metallization of the rotor electrodes is carried out, as seen at 15, through the central opening and terminates at the top metallization coating 13, preferably in ring form. At the side of the disks 13 which are exposed to the outside, that is, exposed to view, each one of the rotors is formed with an index mark 10 to permit visual adjustment.

Springs 7 and 8, respectively (FIGS. 1, 2), which may be disks springs, or three-leg flat springs are secured to the respective shafts, for example by riveting, to provide a bias force and to press the rotor disks against the stator electrode.

The backside of the stator is formed with a common rotor connection 9. The connection of the rotor electrode 14 to terminal 9 is through metallization 15 in the opening 13 of the rotor (FIGS. 15, 17), over the head of the respective shafts 3, 4, and the respective springs 7, 8, which bears against the metallized coating 9. The stator, as well as the rotor terminals are carried around the side edge of the stator support 1, from where electrical connections may be made to the respective electrode, for example by soft-soldering.

Figure 4:
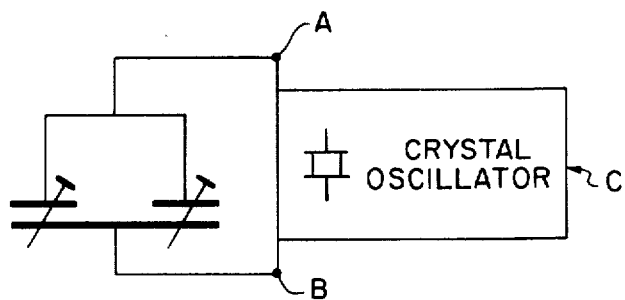
FIG. 4 is a circuit connection of the capacitor in a crystal oscillator.
Figure 5:
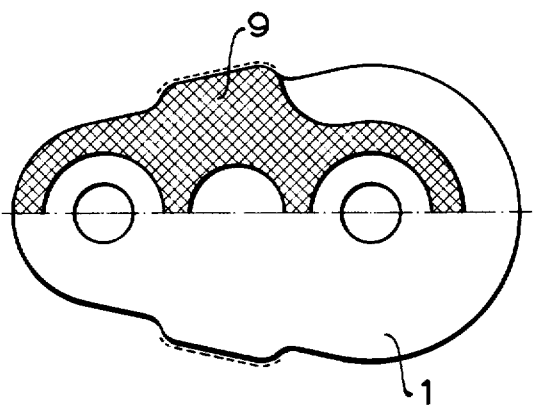
FIG. 5 is a bottom view of the stator alone.
Figure 6:
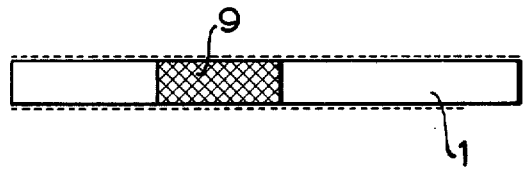
FIG. 6 is a side view of the stator, with metallization coating.
Figure 7:
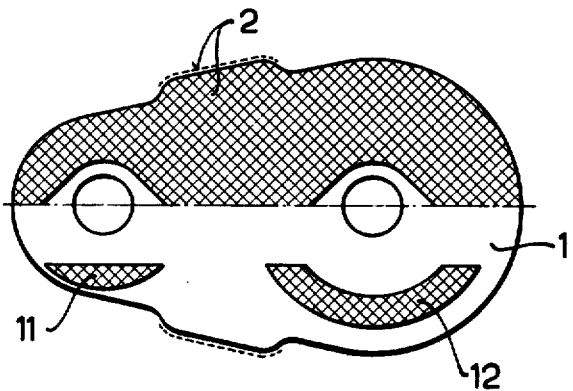
FIG. 7 is a top view of the metallized stator.
Figure 8:
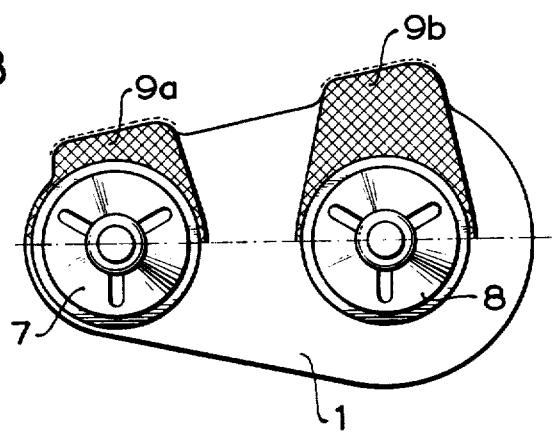
FIG. 8 is a bottom view of a double-disk capacitor for use of serial connection of the two capacitor elements.
Figure 9:
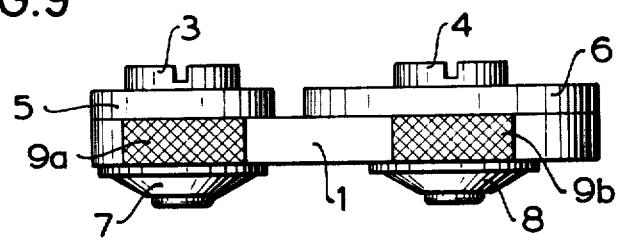
FIG. 9 is a side view of the capacitor of FIG. 8.
Figure 10:
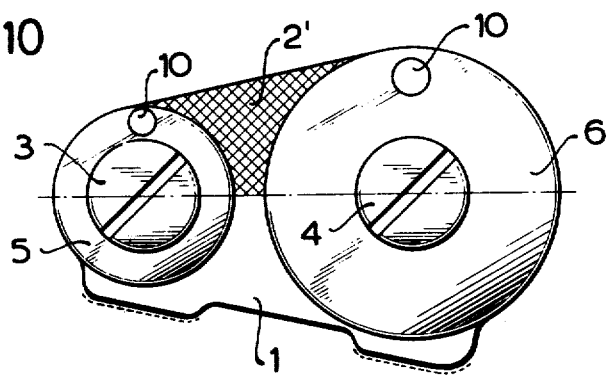
FIG. 10 is a top view of the capacitor of FIG. 8.

Adjustment of a crystal oscillator C (FIG. 4) is carried out by means of the adjustments heads 3, 4. First, the larger one of the rotors 6 is adjusted coarsely, in order to correct the larger tolerances in the watch, for example the tolerance in the quartz frequency. The fine adjustment by means of rotor 4 then corrects for timing of the watch. Trimmer capacitors of 3 and 5 mm rotor diameter may provide control ranges of 1:10 and 1:50, respectively, when connected in parallel as seen in FIG. 4. The common stator connection is connected to terminal B, the common rotor connections are connected to terminal A, both of which are connected, in turn, to the crystal oscillator C.

Figure 11:
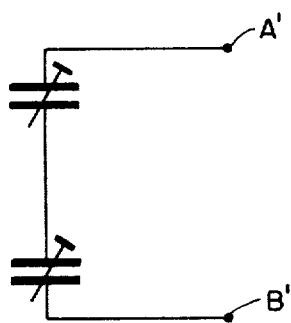
FIG. 11 is a schematic connection diagram of the capacitor of FIG. 8.
Figure 12:
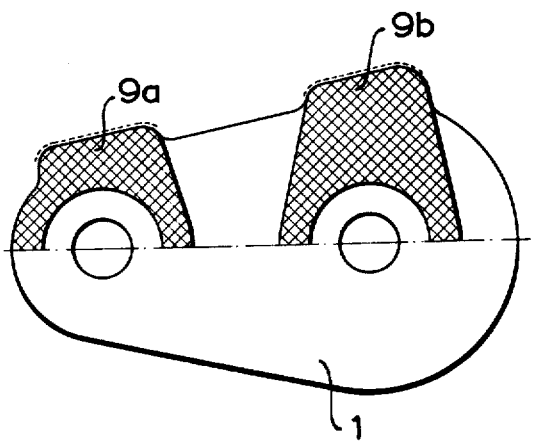
FIG. 12 is a bottom view of the stator alone.
Figure 13:
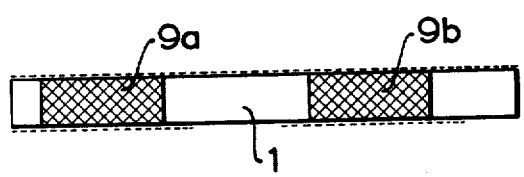
FIG. 13 is a side view of the stator, with metallization coating.
Figure 14:
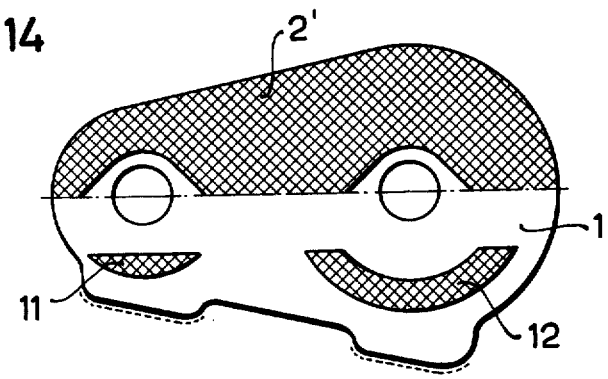
FIG. 14 is a top view of the stator.
Figure 15:
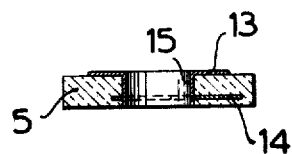
FIG. 15 is a central cross-sectional view of the smaller one of the two rotors for use in the capacitors of FIG. 1 or FIG. 8.
Figure 16:
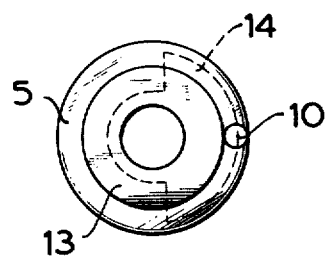
FIG. 16 is a top view of the rotor.
Figure 17:
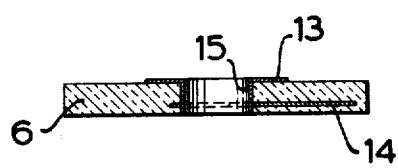
FIG. 17 is a transverse cross-sectional view of the larger one of the rotor disks.
Figure 18:
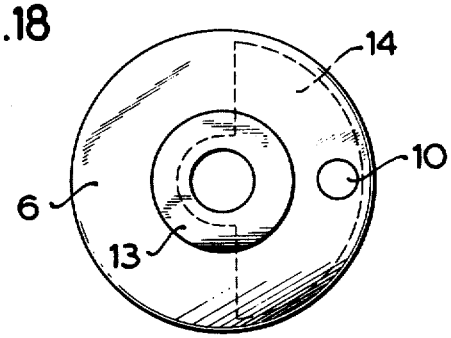
FIG. 18 is a top view of the larger one of the rotor disks.

The trimmer capacitor in accordance with the invention may be used also for serial connection — see FIGS. 8 to 14. The low overall capacity values of the capacitors can be used advantageously when low overall capacity is desired. The rotor with the smaller capacity is then used for coarse adjustment, and the rotor with larger capacity is used for fine adjustment. The circuit for serial connection of the rotors is shown in FIG. 11. The rotors are connected to separate metallization strips 9a, 9b, respectively, which are connected to respective terminals A', B' (FIG. 11). The common stator connection 2' is not carried out over the side edge of the stator disk 1, since it need not be connected to an external circuit.

The trimmer capacitor may readily be made in such a way that it can be directly attached to a printed circuit, or connected by spot-welding, respectively. The diameters of the two rotor disks are matched to the required values of capacity and to space requirements.

Figure 2:
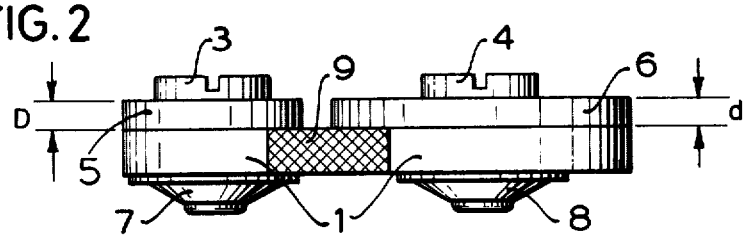
FIG. 2 is a side view of the capacitor.
Figure 3:
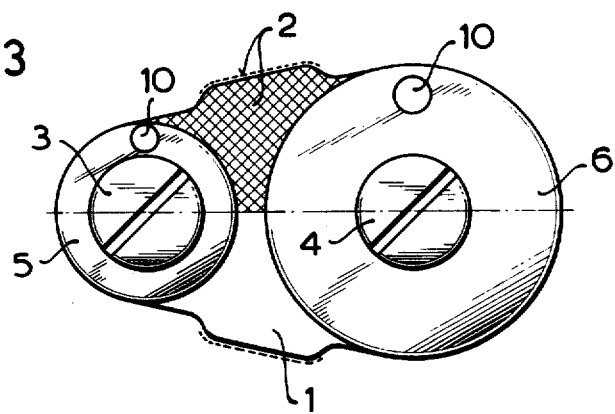
FIG. 3 is a top view of the capacitor.

Greater variations in capacity may be obtained by making the rotor disks of different thickness. Referring to FIG. 2, if the thickness D of rotor disk 5 is increased with respect to the thickness d of rotor disk 4, the capacity of the capacitor formed by the stator coating 2 and the rotor disk 5 will be decreased. It is also possible to make the rotor disks 5, 6 of different materials, having different dielectric constants, and to space the electrodes 14 differently from the bottom face of the respective disks 5 or 6.

Various changes and modifications may be made, and features described in connection with any embodiment can be used with any other one, within the scope of the inventive concept.

I claim:

1. Multiple trimmer capacitor, particularly for adjustment of crystal oscillators, comprising a stator support disk of ceramic material (1) formed with at least two parallel apertures therethrough located side-by-side;

a metallization layer (2,2') on the top side of said disk, shaped to form a common stator electrode;

at least two disk rotors (5, 6) of ceramic, dielectric material, each having an electrically conductive shaft (3, 4) passing through the respective aperture of the stator located in engagement with, and on the metallization layer of the disk;

a rotor electrode (14), each located on each respective disk rotor, the rotor electrode being spaced from the stator electrode;

electrically conductive spring means (7, 8) rotatably securing the shaft, and hence the disk rotors to the support disk (1);

and a conductive coating (9, 9a, 9b) at the bottom side of said support disk (1) forming an electrical connection to the spring means and hence to the shafts to provide at least one terminal for the rotors, each individual rotor electrode and the common stator electrode forming a trimmer capacitor unit;

wherein one rotor disk has a larger diameter than the other to provide rotors of different capacitative characteristics with respect to the common stator electrode (2) to provide different maximum and minimum capacitances and to provide one capacitor unit for fine, and the other capacitor unit for coarse adjustment on the common support disk (1).

2. Capacitor according to claim 1, wherein the rotor disks are circular ceramic elements in the order of about 5 and 3 mm diameter, respectively, and of a thickness in the order of from about 0.2 to 1 mm.

3. Capacitor according to claim 1, wherein (FIGS. 1–7) the conductive coating on the bottom side of the support disk (1) is common to both rotor disks to connect the capacitances of the trimmer units in parallel.

4. Capacitor according to claim 3, wherein the metallization forming the common electrode is carried around the portion of the lateral edge of the stator disk (1) to form a connection means for the stator electrode, and the conductive coating (9) on the bottom side of the support disk (1) is carried around a portion of the lateral edge thereof to form a connection means for the rotor electrodes, with an insulating gap of unmetallized ceramic material on the lateral edge to separate the common rotor connection means and the common stator connection means.

5. Capacitor according to claim 1, wherein (FIGS. 8–14) the conductive coating (9) on the bottom side of the support disk (1) comprises individual paths (9a, 9b) of metallization, each in electric, galvanic connection with a respective rotor disk.

6. Capacitor according to claim 5, wherein the individual metallization paths (9a, 9b) are carried around a portion of the lateral edge of the stator disk to form a connection means for each one of the rotor electrodes separately, with an insulated gap of unmetallized ceramic material therebetween.

7. Multiple trimmer capacitor, particularly for adjustment of crystal oscillators, comprising a stator support disk of ceramic material (1) formed with at least two parallel apertures therethrough located side-by-side;

a metallization layer (2, 2') on the top side of said disk, shaped to form a common stator electrode;

at least two disk rotors (5, 6) of ceramic, dielectric material, each having an electrically conductive shaft (3, 4) passing through the respective aperture of the stator located in engagement with, and on the metallization layer of the disk;

a rotor electrode (14), each located on each respective disk rotor, the rotor electrode being spaced from the stator electrode;

electrically conductive spring means (7, 8) rotatably securing the shaft, and hence the disk rotors to the support disk (1);

and a conductive coating (9, 9a, 9b) at the bottom side of said support disk (1) forming an electrical connection to the spring means and hence to the shafts to provide at least one terminal for the rotors, each individual rotor electrode and the common stator electrode forming a trimmer capacitor unit;

wherein the respective disk rotors are made of materials of different dielectric temperature coefficient to provide rotors of different electrical characteristics with respect to the common stator electrode (2) on the common support disk (1).

8. Multiple trimmer capacitor, particularly for adjustment of crystal oscillators, comprising a stator support disk of ceramic material (1) formed with at least two parallel apertures therethrough located side-by-side;

a metallization layer (2, 2') on the top side of said disk, shaped to form a common stator electrode;

at least two disk rotors (5, 6) of ceramic, dielectric material, each having an electrically conductive shaft (3, 4) passing through the respective aperture of the stator located in engagement with, and on the metallization layer of the disk;

a rotor electrode (14), each located on each respective disk rotor, the rotor electrode being spaced from the stator electrode;

electrically conductive spring means (7, 8) rotatably securing the shaft, and hence the disk rotors to the support disk (1);

and a conductive coating (9, 9a, 9b) at the bottom side of said support disk (1) forming an electrical connection to the spring means and hence to the shafts to provide at least one terminal for the rotors, each individual rotor electrode and the common stator electrode forming a trimmer capacitor unit;

wherein the dielectric constants of the rotor disks are different to provide rotors of different capacitative characteristics with respect to the common stator electrode (2) to provide different maximum and minimum capacitances and to provide one capacitor unit for fine, and the other capacitor unit for coarse adjustment on the common support disk (1).

9. Multiple trimmer capacitor, particularly for adjustment of crystal oscillators, comprising a stator support disk of ceramic material (1) formed with at least two parallel apertures therethrough located side-by-side;

a metallization layer (2, 2') on the top side of said disk, shaped to form a common stator electrode;

at least two disk rotors (5, 6) of ceramic, dielectric material, each having an electrically conductive shaft (3, 4) passing through the respective aperture of the stator located in engagement with, and on the metallization layer of the disk;

a rotor electrode (14), each located on each respective disk rotor, the rotor electrode being spaced from the stator electrode;
electrically conductive spring means (7, 8) rotatably securing the shaft, and hence the disk rotors to the support disk (1);
and a conductive coating (9, 9a, 9b) at the bottom side of said support disk (1) forming an electrical connection to the spring means and hence to the shafts to provide at least one terminal for the rotors, each individual rotor electrode and the common stator electrode forming a trimmer capacitor unit;
wherein the thicknesses of the rotor disks are different to provide rotors of different capacitative characteristics with respect to the common stator electrode (2) to provide different maximum and minimum capacitances and to provide one capacitor unit for fine, and the other capacitor unit for coarse adjustment on the common support disk (1).

10. Capacitor according to claim 7, wherein the conductive coating on the bottom side of the support disk (1) is common to both rotor disks to connect the capacitances of the trimmer units in parallel.

11. Capacitor according to claim 7, wherein the conductive coating (9) on the bottom side of the support disk (1) comprises individual paths (9a, 9b) of metallization, each in electric, galvanic connection with a respective rotor disk.

12. Capacitor according to claim 8, wherein the conductive coating on the bottom side of the support disk (1) is common to both rotor disks to connect the capacitances of the trimmer units in parallel.

13. Capacitor according to claim 8, wherein the conductive coating (9) on the bottom side of the support disk (1) comprises individual paths (9a, 9b) of metallization, each in electric, galvanic connection with a respective rotor disk.

14. Capacitor according to claim 9, wherein the conductive coating on the bottom side of the support disk (1) is common to both rotor disks to connect the capacitances of the trimmer units in parallel.

15. Capacitor according to claim 9, wherein the conductive coating (9) on the bottom side of the support disk (1) comprises individual paths (9a, 9b) of metallization, each in electric, galvanic connection with a respective rotor disk.

* * * * *